United States Patent
Ito et al.

(10) Patent No.: US 8,703,590 B2
(45) Date of Patent: Apr. 22, 2014

(54) VAPOR-PHASE GROWTH METHOD FOR SEMICONDUCTOR FILM

(75) Inventors: Takahiro Ito, Toyota (JP); Takahiro Kozawa, Nagoya (JP); Kenji Nakashima, Nisshin (JP); Keeyoung Jun, Nagoya (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/642,973

(22) PCT Filed: Dec. 8, 2010

(86) PCT No.: PCT/JP2010/072032
§ 371 (c)(1),
(2), (4) Date: Oct. 23, 2012

(87) PCT Pub. No.: WO2011/142055
PCT Pub. Date: Nov. 17, 2011

(65) Prior Publication Data
US 2013/0040441 A1 Feb. 14, 2013

(30) Foreign Application Priority Data
May 14, 2010 (JP) .................................. 2010-112137

(51) Int. Cl.
*H01L 21/20* (2006.01)

(52) U.S. Cl.
USPC ........................................................ 438/507

(58) Field of Classification Search
USPC .................................................. 438/478, 507
See application file for complete search history.

(56) References Cited

U.S. PATENT DOCUMENTS

| | | | |
|---|---|---|---|
| 4,992,301 A | 2/1991 | Shishiguchi et al. | |
| 4,997,678 A | 3/1991 | Taylor et al. | |
| 6,250,914 B1 | 6/2001 | Katsumata et al. | |
| 2003/0072973 A1* | 4/2003 | Nishioka et al. | 428/698 |

FOREIGN PATENT DOCUMENTS

| | | |
|---|---|---|
| JP | 64-089320 A | 4/1989 |
| JP | 3-153873 A | 7/1991 |
| JP | 10-226574 A | 8/1998 |
| JP | 11-263684 A | 9/1999 |
| JP | 2000-306850 A | 11/2000 |

* cited by examiner

*Primary Examiner* — Bradley K Smith
(74) *Attorney, Agent, or Firm* — Sughrue Mion, PLLC

(57) ABSTRACT

A process for supplying a mixed material gas that includes a chlorosilane gas and a carrier gas to a surface of a substrate heated at 1200 to 1400° C. from a direction perpendicular to the surface is provided. A supply rate of the chlorosilane gas is equal to or more than 200 μmol per minute per 1 cm² of the surface of the substrate. The carrier gas includes a hydrogen gas and at least one or more gases selected from argon, xenon, krypton and neon.

4 Claims, 5 Drawing Sheets

VAPOR-PHASE GROWTH METHOD FOR SEMICONDUCTOR FILM

CROSS REFERENCE TO RELATED APPLICATIONS

This application is a National Stage of International Application No. PCT/JP2010/072032 filed Dec. 8, 2010, claiming priority based on Japanese Patent Application No. 2010-112137, filed May 14, 2010, the contents of all of which are incorporated herein by reference in their entirety.

TECHNICAL FIELD

This application claims priority to Japanese Patent Application No. 2010-112137, filed on May 14, 2010, the contents of which are hereby incorporated by reference into the present application. The present application discloses a vapor-phase growth technique for growing a semiconductor film on a surface of a substrate.

BACKGROUND ART

A vapor-phase growth method for growing a semiconductor film on a surface of a substrate is known. A technique is disclosed in Japanese Patent Application Publication No. 2000-306850 in which raw material gas is supplied to a surface of a substrate heated at 1000° C. from a direction perpendicular to the surface. The "raw material gas" here refers to a gas that includes an element constituting the semiconductor film.

SUMMARY OF THE INVENTION

Technical Problem

A method for increasing the growth rate of a semiconductor film is a method in which the rate of raw material gas supplied to a surface of a substrate is increased. The raw material gas may decompose during the gas phase before reaching the surface of the substrate. If the rate of raw material gas supplied increases, the amount of raw material gas decomposing during the gas phase also increases, and more reaction product is generated, in the following description, the product generated by the decomposition of the raw material gas during the gas phase is called the "reaction product". Further, "the rate of raw material gas" in the present specification is the molar amount of raw material gas introduced per unit time per unit area.

For example, in case chlorosilane gas is used as the raw material gas, the chlorosilane gas decomposes during the gas phase, generating hydrogen chloride gas, which is the reaction product. If the amount of chlorosilane gas in the gas phase increases, the amount of hydrogen chloride gas, which is the reaction product, increases. On the other hand, when crystal growth of the semiconductor film occurs on the substrate, hydrogen chloride gas, which is a by-product, is generated from the surface of the substrate. That is, in case chlorosilane gas is used as the raw material gas, the reaction product generated during the gas phase and the by-product generated from the surface of the substrate are the same. If a large quantity of the by-product is present on the surface of the substrate, an opposite reaction (reverse reaction) occurs when crystal growth is to occur, and the growth rate of the semiconductor film decreases. Similarly, if a large quantity of the reaction product is present in the gas phase, the growth rate of the semiconductor film decreases. Consequently, even if the rate of raw material gas supplied to the surface of the substrate is increased, a growth rate commensurate with the rate of raw material gas supplied cannot be achieved. That is, even if the rate of raw material gas supplied to the surface of the substrate is increased, the growth rate of the semiconductor film will not necessarily increase. If the rate of raw material gas supplied is excessive, the growth rate of the semiconductor film will be saturated (or will become slower).

Another method to increase the growth rate of the semiconductor film is a method in which the temperature of the substrate is increased. If the temperature of the substrate is increased, the crystal growth of the semiconductor film on the surface of the substrate is accelerated. Consequently, it would seem at first glance that the growth rate of the semiconductor film would increase if the temperature of the substrate is increased. However, if the temperature of the substrate is increased, the temperature of the raw material gas supplied to the substrate also increases. Consequently, the decomposition of the raw material gas is accelerated, and the amount of reaction product in the gas phase increases. In particular, if the rate of raw material gas supplied to the surface of the substrate is increased while the temperature of the substrate has been increased, the amount of reaction product in the gas phase increases markedly, inhibiting the crystal growth of the semiconductor film. Consequently, even if the temperature of the substrate is increased, the supply rate of the raw material gas cannot be increased, and the growth rate of the semiconductor film cannot be increased satisfactorily.

For the above reasons there has conventionally been a limit on increasing the temperature of the substrate and on the rate of raw material gas that could be supplied to the surface of the substrate. Therefore, the growth rate of the semiconductor film could not be increased satisfactorily. The art disclosed in the present specification aims to present a technique for making the growth rate of semiconductor film faster, in the vapor-phase growth technique, than in the conventional art.

Solution to the Technical Problem

The art disclosed in the present specification is characterized in increasing the temperature of a substrate to a temperature higher than that conventionally adopted while suppressing an increase in the temperature of a raw material gas supplied to the substrate. Thereby, the rate of raw material gas supplied to the surface of the substrate can be increased, and the growth rate of the semiconductor film can be faster than the conventional growth rate. Moreover, the raw material gas is transported to the surface of the substrate in a mixed material gas state, in which the raw material gas has been mixed with carrier gas. In the art disclosed in the present specification, the carrier gas in the mixed material gas suppresses the temperature increase of the raw material gas. Specifically, the carrier gas is characterized in including a hydrogen gas and at least one or more gases selected from argon, xenon, krypton and neon. Moreover, in the conventional vapor-phase growth method, only hydrogen gas is used as the carrier gas.

The specific heat at constant pressure (heat capacity) of argon, krypton and neon is greater than that of hydrogen gas. The carrier gas that includes these gases will not readily increase in temperature even if the temperature of the substrate is high. Consequently, the temperature increase of the raw material gas in the mixed material gas is suppressed. The decomposition of the raw material gas during the gas phase is suppressed, and the generation of hydrogen chloride gas, which is the reaction product, can be suppressed. Even if the rate of raw material gas supplied to the surface of the substrate is increased, the crystal growth of the semiconductor film is not readily inhibited by the reaction product. Consequently, the temperature of the substrate can be increased while the rate of raw material gas supplied to the surface of the substrate is increased. Therefore, the growth rate of the semiconductor film can be made faster than the conventional growth rate.

The art disclosed in the present specification is used in a vapor-phase growth method for growing a semiconductor film on a surface of a substrate. This vapor-phase growth method comprises supplying a mixed material gas that includes a chlorosilane gas and a carrier gas to the surface of the substrate heated at 1200 to 1400° C. from a direction perpendicular to the surface. A supply rate of the chlorosilane gas is equal to or more than 200 μmol per minute per 1 $cm^2$ of the surface of the substrate. The carrier gas includes a hydrogen gas and at least one or more gases selected from argon, xenon, krypton and neon.

According to the above method, since the temperature increase of the carrier gas is suppressed, the temperature increase of the raw material gas is suppressed. Consequently, the substrate can be heated to 1200 to 1400° C., which is higher than the conventional vapor-phase growth method. Further, since the decomposition of the raw material gas can be suppressed, the supply rate of the raw material gas that is supplied per 1 $cm^2$ of the surface of the substrate can be equal to or more than 200 μmol per minute, which is greater than the supply rate in the conventional vapor-phase growth method. In case chlorosilane gas is used as the raw material gas, crystal growth of silicon film occurs on the substrate. The melting point of silicon is approximately 1400° C. Consequently, in the above method, the heating temperature of the substrate is equal to or less than 1400° C. Moreover, the substrate is more preferably heated to 1200 to 1350° C.

In the above vapor-phase growth method, the rate of the at least one or more gases selected from argon, xenon, krypton and neon included in the carrier gas is preferably 0.01 to 0 vol % (volume percent). As described above, the carrier gas includes hydrogen gas in addition to the at least one or more gases selected from argon, xenon, krypton and neon. The hydrogen gas reacts with the chlorine radicals of the chlorosilane gas hound to the surface of the substrate, removing the chlorine radicals from the surface of the substrate. Therefore, silicon remains on the surface of the substrate, and the crystal growth of the semiconductor film occurs. If a gas other than hydrogen gas is included excessively in the carrier gas, the relative rate of hydrogen gas is reduced. It is more difficult for the hydrogen gas to react with the chlorine radicals, and the growth rate of the semiconductor film slows. If the rate of the at least one or more gases selected from argon, xenon, krypton and neon is 0.01 to 10 vol %, the chlorine radicals can be removed efficiently from the surface of the substrate while a temperature increase of the mixed material gas is suppressed.

In the above vapor-phase growth method, fixed material gas is preferably supplied while the substrate is rotated at equal to or more than 1000 rpm. The temperature increase of the mixed material gas can be suppressed further. The decomposition of the raw material gas in the gas phase can be suppressed further, and the growth rate of the semiconductor film can be increased further.

In the above vapor-phase growth method, the melting point of the substrate is preferably higher than the melting point of silicon. Sapphire ($Al_2O_3$), silicon carbide (SiC), spinel ($MgAlO_4$) and group-111 nitride semiconductors (GaN, AlN, AlGaN), etc. can be given as the material of this type of substrate.

Effect of the Invention

According to the art disclosed in the present specification, the vapor-phase growth of a semiconductor film can be performed faster than in the conventional case.

DESCRIPTION OF THE EMBODIMENTS

Figure 1:
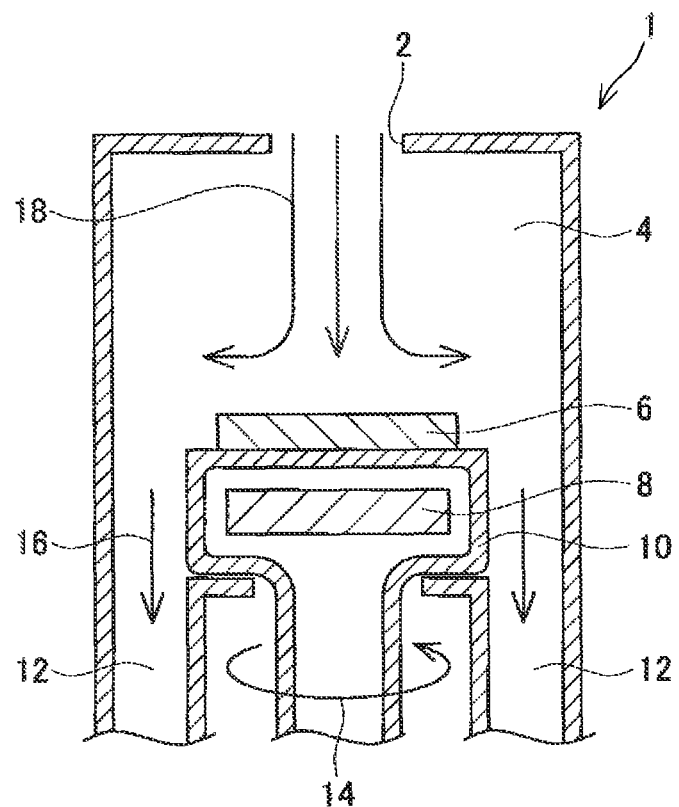
FIG. 1 shows a vapor phase growth apparatus used in a vapor-phase growth method of the present embodiment.

Before describing the embodiment, several technical features of the embodiment will be noted below.

(Feature 1) The mixed material gas is supplied to the surface of the substrate while the temperature of the mixed material gas is being maintained at equal to or less than 1000° C.

(Feature 2) A silicon semiconductor film is grown on the surface of an aluminum nitride substrate.

Embodiment

First, a vapor phase growth apparatus 1 will be described with reference to FIG. 1. The vapor phase growth apparatus 1 comprises a vapor chamber 4, a mounting base 10 and a heater 8. A raw material supply port 2 is provided at an upper part of the vapor chamber 4. The raw material supply port 2 is provided at a direction perpendicular to the surface direction of the mounting base 10. An exhaust port 12 is provided at a lower part of the vapor chamber 4. Mixed material gas 18 is introduced through the raw material supply port 2 into the vapor chamber 4 from a raw material gas tank (not shown). Exhaust gas 16 is discharged through the exhaust port 12 from the vapor chamber 4 to the exterior of the vapor phase growth apparatus 1. The mounting base 10 can rotate by means of a motor (not shown), as shown by an arrow 14. A substrate 6 can be placed on a surface of the mounting base 10. The heater 8 is provided within the mounting base 10. The substrate 6 can be heated to a predetermined temperature by the heater 8.

Next, a vapor-phase growth method for growing a semiconductor film on a surface of the substrate will be described. In the present embodiment, a method for growing a silicon (Si) semiconductor film on the surface of an aluminum nitride (AlN) substrate will be described. First, after the aluminum nitride substrate 6 has been mounted on the surface of the mounting base 10, the aluminum nitride substrate 6 is heated to 1300° C. while the mounting base 10 is rotated at equal to or more than 1000 rpm. Then, while the temperature of the aluminum nitride substrate 6 is being maintained at 1300° C., the mixed material gas 18 is introduced into the vapor chamber 4 from the raw material supply port 2. The mounting base 10 continues to be rotated at equal to or more than 1000 rpm while the mixed material gas 18 is being introduced into the vapor chamber 4. Moreover, as will be described in detail later, the temperature of the aluminum nitride substrate 6 may be maintained within the range 1200 to 1350° C. In the conventional art, in case of causing the crystal growth of a silicon film on the surface of the substrate, the vapor-phase growth is performed while the substrate has been heated to 900 to 1200° C. In the present embodiment, the vapor-phase growth is performed while the temperature of the substrate is being maintained at a higher temperature than in the conventional art.

The mixed material gas 18 includes a raw material gas and a carrier gas. The raw material gas is silane trichloride gas (trichlorosilane: $SiHCl_3$). The raw material gas is supplied at rate equal to or more than 200 μmol per minute per 3 cm² of the surface of the aluminum nitride substrate 6 (called substrate unit area below). The carrier gas includes argon (Ar) gas and hydrogen ($H_2$) gas. The volume percent of the argon gas in the carrier gas is 1.0 vol %. As will be described in detail later, the volume percent of the argon gas in the carrier gas is preferably 0.1 to 10 vol %. Further, in addition to the argon gas and hydrogen gas, the mixed material gas 18 may include an impurity dopant gas. If the impurity dopant gas is included in the mixed material gas 18, the crystal growth of n-type or p-type silicon film can be caused. Moreover, for reasons described later, in the conventional vapor-phase growth technique, the supply rate of the raw material gas is 100 to 200 μmol per minute per substrate unit area. In the present embodiment, a larger amount of raw material gas is supplied to the substrate than was possible in the conventional vapor-phase growth technique.

The raw material supply port 2 is provided at a direction perpendicular to the surface of the aluminum nitride substrate 6. Consequently, the mixed material gas 18 introduced into the vapor chamber 4 is supplied to the aluminum nitride substrate 6 from a directions perpendicular to the surface of the aluminum nitride substrate 6. This method can reduce the distance that the mixed material gas 18 travels in the vicinity of the surface of the aluminum nitride substrate 6 compared to the method in which the mixed material gas 18 is supplied from a direction parallel to the surface of the aluminum nitride substrate 6. Consequently, it is possible to suppress a temperature increase of the mixed material gas 18 caused by the heat of the aluminum nitride substrate 6.

When the mixed material gas 18 reaches the surface of the aluminum nitride substrate 6, the silicon atoms that comprise the raw material gas bond with the surface of the aluminum nitride substrate 6. Consequently, the crystal growth of the silicon film occurs. The mixed material gas 18 that was not used in the crystal growth, and by-products created by the crystal growth, are discharged through the exhaust port 12 to the exterior of the vapor phase growth apparatus 1.

Figure 2:
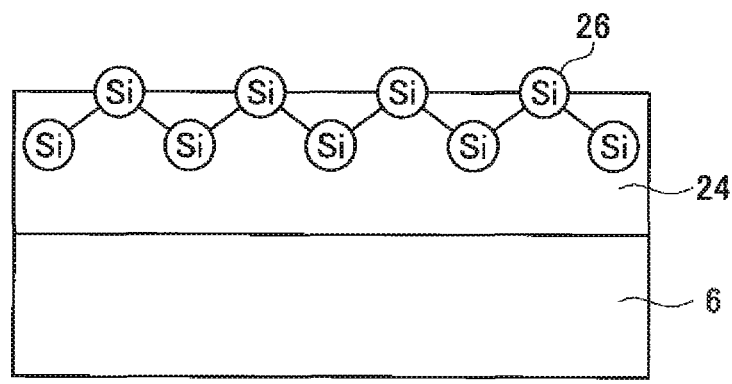
FIG. 2 schematically shows a process for growing semiconductor film (Process 1).

The process of growing the silicon film on the surface of the aluminum nitride substrate 6 will be described with reference to the schematic views of FIG. 2 to FIG. 5. FIG. 2 shows a stage during the vapor-phase growth of a silicon film 24 on the surface of the aluminum nitride substrate 6. The reference number 26 schematically shows silicon atoms that comprise the silicon film 24. The crystal growth of the silicon film 24 occurs by new silicon atoms bonding with the silicon atoms 26 exposed at the surface of the silicon film 2. That is, the thickness of the silicon film 24 increases.

Figure 3:
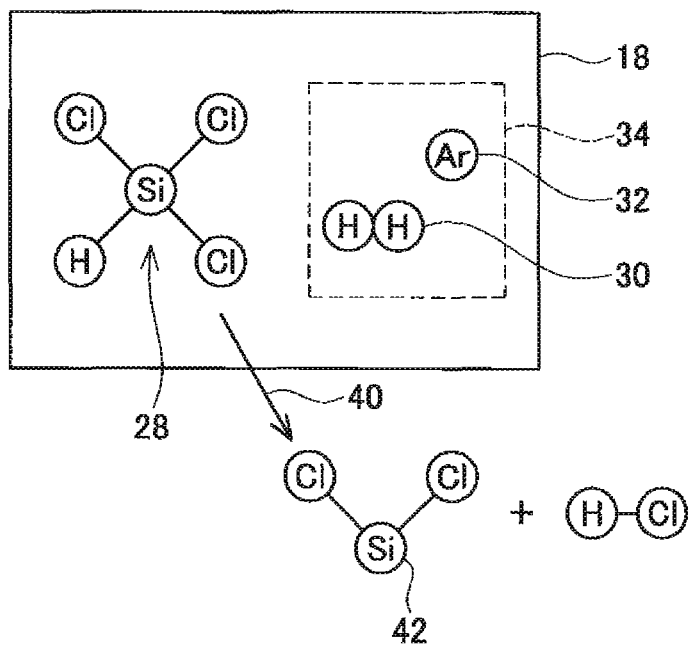
FIG. 3 schematically shows the process for growing the semiconductor film (Process 2).

FIG. 3 schematically shows the mixed material gas 18. The mixed ma gas 18 includes silane trichloride gas 28 and the carrier gas 34. The carrier gas 34 includes argon gas 32 and hydrogen gas 30. Moreover, FIG. 3 shows the silane trichloride gas 28, the argon gas 32 and the hydrogen gas 30 schematically, and does not show the rate of these gases accurately. As shown by an arrow 40, the silane trichloride gas 28 decomposes into $SiCl_2$ and hydrogen chloride (HCl) gas within the space of the vapor chamber 4. That is, the silane trichloride gas 28 introduced into the vapor chamber 4 undergoes a reaction (decomposition) indicated in formula (1) below.

$$SiHCl_3 \rightarrow SiCl_2 + HCl \qquad \text{Reaction Formula (1)}$$

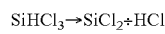

The reaction of formula (1) occurs more easily when the temperature of the silane trichloride gas 28 exceeds 900C, and the higher the temperature of the silane trichloride gas 28 increases, the more active the reaction becomes. That is, the decomposition of the chlorosilane gas 28 proceeds as its temperature increases. As described above, in the present embodiment, the argon gas 32 is included in the carrier gas 34. The argon gas 32 has a higher constant heat capacity than the hydrogen gas 30. Consequently, the carrier gas 34 that includes the argon gas 32 increases in temperature less readily than a carrier gas that includes only hydrogen gas. Therefore, with the carrier gas 34 of the present embodiment, the temperature increase can be suppressed compared to the conventional carrier gas that includes only hydrogen gas. Consequently, a temperature increase of the silane trichloride gas 28 can also be suppressed. Further, as described above, in the present embodiment, the mixed material gas 18 is supplied from a direction perpendicular to the surface of the aluminum nitride substrate 6. Consequently, in the vapor-phase growth method of the present embodiment, the temperature increase of the silane trichloride gas 28 is further suppressed, allowing the progress of decomposition of the reaction formula (1) to be suppressed.

Figure 4:
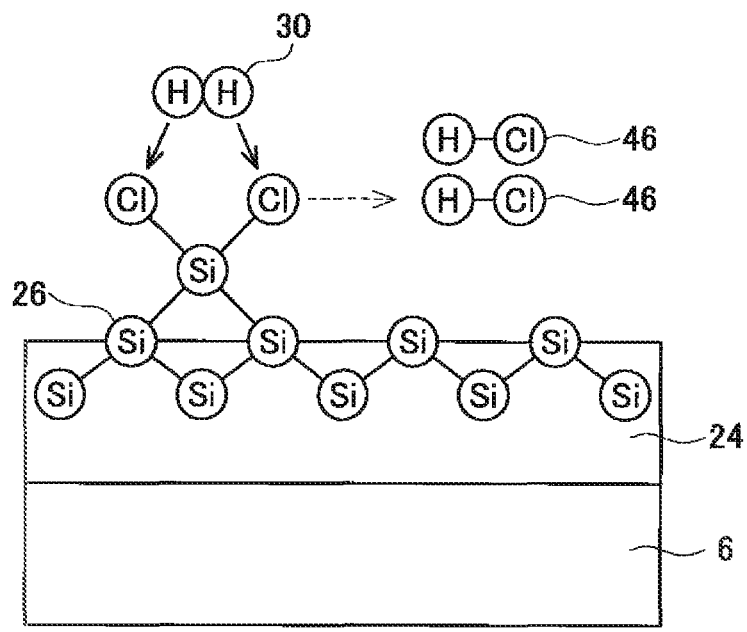
FIG. 4 schematically shows the process for growing the semicoductor film (Process 3).
Figure 5:
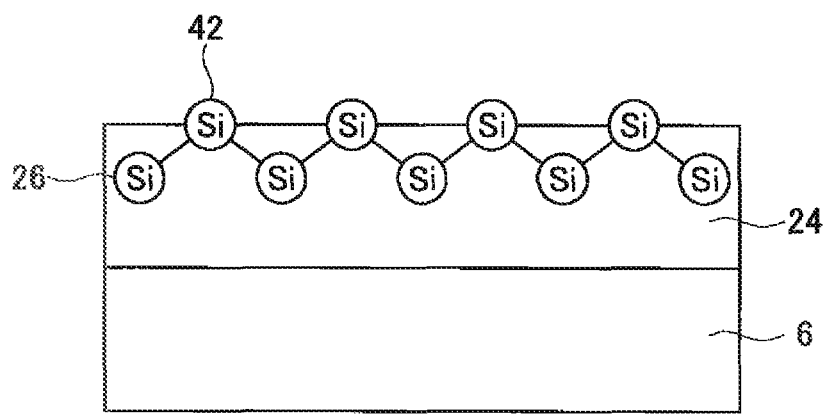
FIG. 5 schematically shows the process for growing the semiconductor film (Process 4).

FIG. 4 and FIG. 5 schematically show the process of the silane trichloride gas 28 bonding with the silicon atoms 26 exposed at the surface of the silicon film 24 (see also FIG. 2), and the thickness of the silicon film 24 increasing. As shown in FIG. 4, first, the Si atom of $SiCl_2$ generated by the reaction formula (1) bonds with the silicon atoms 26 at the surface of the silicon film 24. Then, the hydrogen gas 30 in the carrier gas 34 bonds with the Cl atoms, and hydrogen chloride gas 46 is generated. The hydrogen chloride gas 46 is a by-product that accompanies crystal growth. As shown in FIG. 5, a growth film of Si atoms 42 on the surface of the Si atoms 26 is formed by removing the Cl atoms from the surface of the silicon film 24. Consequently, the thickness of the silicon film 24 increases. The Si atoms 26 shown in FIG. 5 are the Si atoms exposed at the surface of the silicon film 24 in FIG. 2. The reaction shown in FIG. 4 and FIG. 5 can be represented by reaction formula (2) below.

$$SiCl_2 + H_2 \rightarrow Si + 2HCl \qquad \text{Reaction Formula (2)}$$

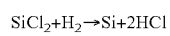

The reaction of reaction formula (2) (the growth of the silicon film) becomes more active the higher the temperature increases. Moreover, a reaction represented by reaction formula (3) below is also performed at a constant rate at the surface of the silicon film 24.

$$Si + 3HCl \rightarrow SiHCl_3 + H_2 \qquad \text{Reaction Formula (3)}$$

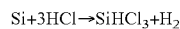

Reaction formula (3) is the reverse reaction to reaction formula (2) above. When the reaction of reaction formula (3)

becomes more active, the growth rate of the silicon film 24 decreases. The greater the concentration of the hydrogen chloride gas in the gas phase increases, the more readily reaction formula (3) occurs. That is, the further the decomposition of the silane trichloride gas 28 introduced into the vapor chamber 4 proceeds (the more reaction formula (1) proceeds), the greater the decrease in the growth rate of the semiconductor film 24 is.

As described above, in the vapor-phase growth method of the present embodiment, the mixed material gas 18 is supplied from a direction perpendicular to the surface of the aluminum, nitride substrate 6. Further the argon gas 32 is included in the carrier gas 34. Thereby, even if the temperature of the aluminum nitride substrate 6 is maintained at the high temperature of 1300° C., the decomposition of reaction formula (1) does not occur readily. As described above, the conventional vapor-phase growth technique kept the temperature of the substrate at 900 to 1200° C. in order to suppress the decomposition of reaction formula (1). Even though it was recognized that the growth of reaction formula (2) becomes more active if the temperature of the substrate is increased, in the conventional vapor-phase growth technique, the temperature of the substrate was made low in order to suppress the decomposition of reaction formula (1). Consequently, since the growth of reaction formula (2) above was not performed actively, the rate of raw material gas introduced could not be increased above 200 µmol. By contrast, in the vapor-phase growth method of the present embodiment, the temperature of the substrate can be increased to a higher temperature than in the conventional vapor-phase growth technique by suppressing the decomposition of reaction formula (1), and therefore the rate of raw material gas introduced can be increased. Consequently, in the vapor-phase growth method of the present embodiment, the growth rate of the silicon film can be made faster than the conventional growth rate.

As shown in reaction formula (2), the hydrogen gas 30 is needed for the crystal growth of the silicon film 24. If the rate of the hydrogen gas 30 in the carrier gas 34 becomes lower, it becomes difficult for reaction formula (2) to occur. Therefore, it is undesirable for the volume percent of the argon gas 32 in the carrier gas 34 to be excessively high. In order to not inhibit the growth of reaction formula (2) while suppressing a temperature increase of the mixed material gas 18, the volume percent of the argon gas 32 in the carrier gas 34 is preferably 0.1 to 10 vol. %.

In the above embodiment, vapor-phase growth is performed while the temperature of the aluminum nitride substrate 6 is maintained at 1300° C. The temperature to which the aluminum nitride substrate 6 is heated may be in the range 1200° C. to 1400° C. If the temperature of the aluminum nitride substrate 6 is equal to or more than 1200° C., the growth rate of the silicon film can be made fast enough. Moreover, since the melting point of silicon is approximately 1400° C., the temperature to which the aluminum nitride substrate 6 is heated is preferably equal to or below 1400° C. Consequently, the temperature to which the aluminum nitride substrate 6 is heated is more preferably 1200 to 1350° C. Moreover, the temperature of the mixed material gas 18 introduced into the vapor chamber 4 is preferably equal to or below 1000° C. Therefore, the decomposition of reaction formula (1) does not readily occur during the gas phase.

Instead of the aluminum nitride substrate 6, a substrate made from a material such as sapphire, silicon carbide, spinel or other group-111 nitride semiconductors (GaN, AlGaN, etc.) may be used. The melting point of these substrates is higher than the melting point of silicon. Consequently, even if the temperature to which the substrate is heated is set close to the melting point of silicon, the substrate does not readily deform, etc. Moreover, the thermal expansion coefficient of aluminum nitride and silicon carbide is close to the thermal expansion coefficient of silicon. Therefore, aluminum nitride substrates and silicon carbide substrates are particularly preferred from among these substrates. Further, the material of the substrate may be silicon. That is, the crystal growth of the silicon film may be caused on the surface of a silicon substrate.

Figure 6:
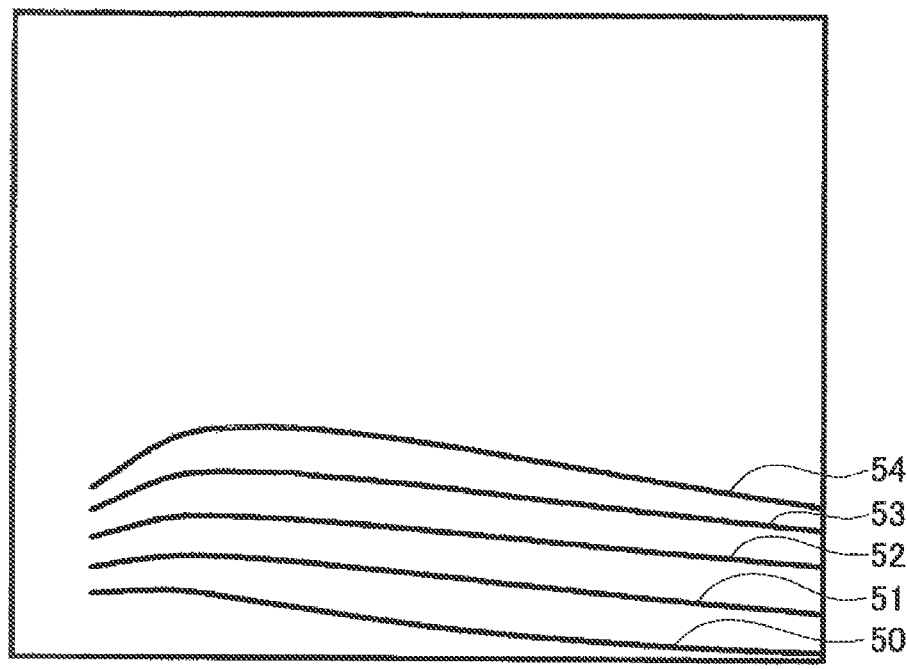
FIG. 6 shows the relationship between a supply rate of a raw material gas and growth rate of the semiconductor film.

Increasing the growth rate of the semiconductor film 24 by suppressing the temperature increase of the mixed material gas 18 will be described with reference to FIG. 6 to FIG. 9. The graphs of FIG. 6 to FIG. 6 are simulation results showing the relationship between the growth rate of the silicon film 24 and the supply rate of the silane trichloride gas per substrate unit area. In the graphs shown in FIG. 6 to FIG. 9, the horizontal axis shows the molar concentration of the silane trichloride gas in the mixed material gas. The molar concentration of the silane trichloride gas increases toward the right side of the graph. That is, the supply rate per substrate unit area increases toward the right side of the graph. The vertical axis shows the growth rate of the silicon film. The growth rate of the silicon film increases toward the top side of the graph.

FIG. 6 shows the results when the temperature of the substrate and of the mixed material gas are the same. A curve 50 shows the results when the temperature of the substrate (of the mixed material gas) is 1000° C., a curve 51 shows the results when the temperature of the substrate is 1050° C., a curve 52 shows the results when the temperature of the substrate is 1100° C., a curve 53 shows the results when the temperature of the substrate is 1150° C., and a curve 54 shows the results when the temperature of the substrate is 1200° C.

As is clear from FIG. 6, the growth rate of the silicon film increases as the temperature of the substrate increases. However, in the case of all the temperatures of the substrate, the growth rate of the silicon film shifts from increasing to decreasing when the molar concentration of the silane trichloride is increased. That is, even if the temperature of the substrate is high, since this is accompanied by the decomposition of the silane trichloride gas (reaction formula (1)), the molar concentration of the silane trichloride gas in the mixed material gas cannot be sufficiently concentrated. Moreover, the molar concentration of the silane trichloride gas when the growth rate of the silicon film begins to be saturated is equivalent to the molar concentration when the supply rate of the silane trichloride gas supplied per 1 $cm^2$ of the surface of the substrate is 200 µmol per minute. That is, when the supply rate of the silane trichloride gas exceeds approximately 200 µmol per minute, it starts to become difficult to obtain a growth rate commensurate with the supply rate of the silane trichloride gas.

Figure 7:
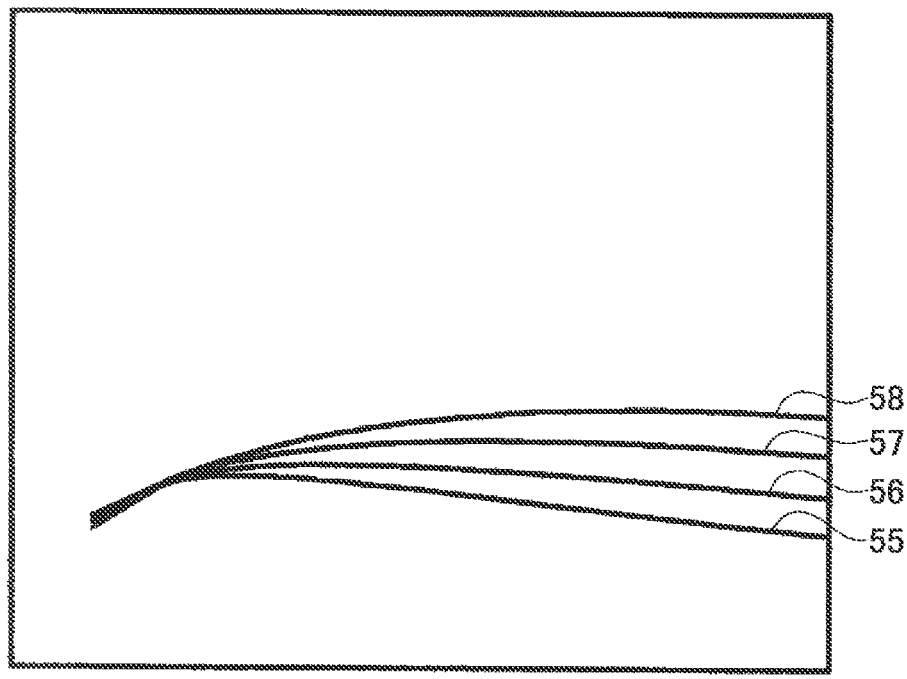
FIG. 7 shows the relationship between the supply rate of the raw material gas and the growth rate of the semiconductor film.

FIG. 7 shows the results when the temperature of the substrate was constant and the temperature of the mixed material gas was changed. The temperature of the substrate was 1150° C. A curve 55 shows the results when the temperature of the mixed material gas was 1150° C., a curve 56 shows the results when the temperature of the mixed material gas was 1100° C., a curve 57 shows the results when the temperature of the mixed material gas was 1050° C. and a curve 58 shows the results when the temperature of the mixed material gas was 1000° C. The curve 55 shows the results when both the temperature of the mixed material gas and the temperature of the substrate were 1150° C. That is, the curve 55 shows the same results as the curve of FIG. 6.

As is clear from FIG. 7, in case the temperature of the substrate is constant, the lower the temperature of the mixed material gas, the faster the growth rate of the silicon film. Further, the lower the temperature of the mixed material gas, the greater the molar concentration of the silane trichloride when the growth rate of the silicon film shifts from increasing to decreasing. That is, if the temperature of the mixed material gas is maintained at a lower temperature, the concentration of the raw material gas is increased, and the growth rate of the semiconductor film can be increased.

FIG. 1 shows the results when the temperature of the mixed material gas was constant and the temperature of the substrate was changed. The temperature of the mixed material gas was 1000° C. A curve 60 shows the results when the temperature of the substrate was 1100° C., a curve 61 shows the results when the temperature of the substrate was 1150° C., a curve 62 shows the results when the temperature of the substrate was 1200° C., a curve 63 shows the results when the temperature of the substrate was 1250° C., a curve 64 shows the results when the temperature of the substrate was 1300° C., a curve 65 shows the results where the temperature of the substrate was 1350° C., and a curve 66 shows the results when the temperature of the substrate was 1400° C. The curve 61 shows the results when the temperature of the substrate was 1150° C. and the temperature of the mixed material gas was 1100° C. That is, the curve 61 shows the same results as the curve 58 of FIG. 7.

Figure 8:
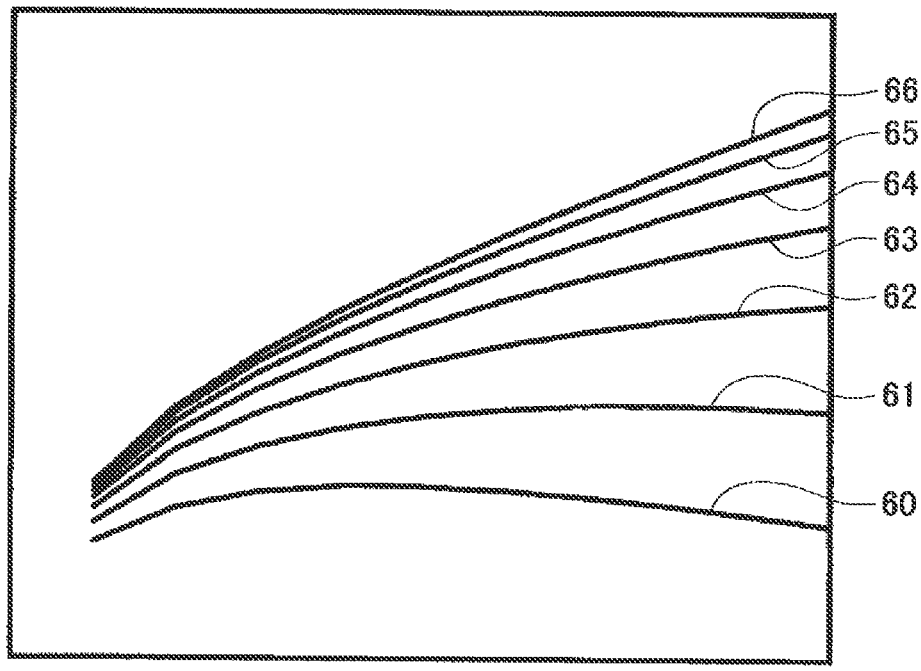
FIG. 8 shows the relationship between the supply rate of the raw material gas and the growth rate of the semiconductor film.

As shown in FIG. 8, in the curves 60, 61, when the concentration of the silane trichloride increases, the growth rate of the silicon film shifts from increasing to decreasing. By contrast, in the curves 62 to 66, the more the concentration of the silane trichloride increases, the more the growth rate of the silicon film increases. That is, the growth rate of the silicon film is not saturated. The results of FIG. 8 show that, in case the temperature of the mixed material gas is 1000° C., the temperature of the substrate is preferably set to equal to or more than 1200° C.

Figure 9:
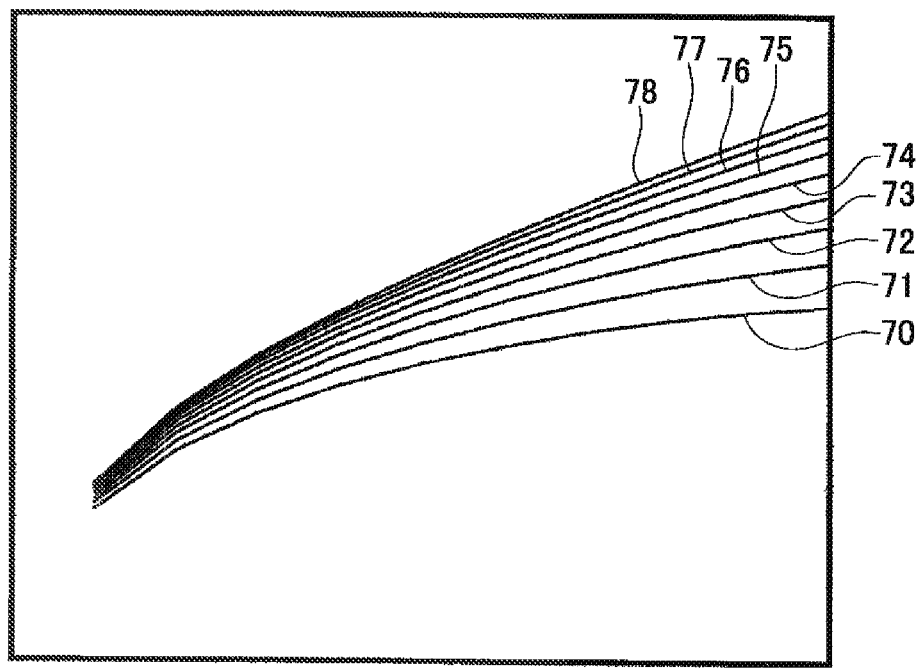
FIG. 9 shows the relationship between the supply rate of the raw material gas and the growth rate of the semiconductor film.

As with FIG. 8, FIG. 9 shows the results when the temperature of the mixed material gas was constant at 1000° C. and the temperature of the substrate was changed. FIG. 9 shows the results when the temperature of the substrate was changed more finely than in FIG. 8 for the temperatures 1200° C. to 1400° C. A curve 70 shows the results when the temperature of the substrate was 1200° C., a curve 71 shows the results when the temperature of the substrate was 1225° C., a curve 72 shows the results when the temperature of the substrate was 1250° C., a curve 73 shows the results when the temperature of the substrate was 1275° C., a curve 74 shows the results when the temperature of the substrate was 1300° C., a curve 75 shows the results when the temperature of the substrate was 1325° C., a curve 76 shows the results when the temperature of the substrate was 1350° C., a curve 77 shows the results when the temperature of the substrate was 1375° C. and a curve 78 shows the results when the temperature of the substrate was 1400° C.

As shown ire FIG. 9, if the temperature of the substrate is maintained at 1200° C. to 1400° C. and the temperature of the mixed material gas (of the silane trichloride) is 1000° C., the growth rate of the silicon film increases as the concentration of the silane trichloride increases. Consequently, the supply rate of the silane trichloride per substrate unit area (the concentration of silane trichloride) can be adjusted freely. Moreover, as described above, taking the melting point of silicon into consideration, the temperature of the substrate is preferably equal to or below 1350° C.

In the above embodiment, the mixed material gas 18 is introduced into the vapor chamber 4 while the mounting base 10 is being rotated at 1000 rpm. The faster the rotation speed of the mounting base 10, the greater the temperature increase of the mixed material gas 18 is suppressed. That is, in the above embodiment, the mounting base 10 is rotated at 1000 rpm in order to suppress the temperature increase of the mixed material gas 18. In order to further suppress the temperature increase of the mixed material gas 18, the mounting base 10 may be rotated at a faster speed than 1000 rpm. Further, if the decomposition of the mixed material gas 18 is suppressed by another method, the mounting base 10 may be rotated at less than 1000 rpm. Moreover, there are other methods for suppressing the temperature increase of the mixed material gas 18, for example, increasing the flow speed of the mixed material gas 18, or lowering the temperature of the mixed material gas 18 before its introduction into the vapor chamber 4, etc. In addition to the method of increasing the speed with which the mixed material gas 18 is introduced into the vapor chamber 4 in order to increase the flow speed of the mixed material gas 18, there is the method of reducing pressure within the vapor chamber 4, thereby increasing the speed of movement with which the mixed material gas 18 is introduced into the vapor chamber 4. Further, methods for lowering the temperature of the mixed material gas 18 before its introduction into the vapor chamber 4 include cooling the introduction path communicating with the raw material supply port 2 of the vapor chamber 4, etc.

In the above embodiment, an example was described that uses silane trichloride gas as the raw material gas. Instead of the aflame trichloride gas, silane dichloride (dichlorosilane: $SiH_2Cl_2$), silicon tetrachloride gas (tetrachlorosilane), etc. can also be used.

Further, one or more gases selected from xenon gas, krypton gas and neon gas may be included in the carrier gas instead of, or together with, the argon gas. The gas included together with the hydrogen gas in the carrier gas may be any gas that has a smaller constant heat capacity than hydrogen gas and that does not affect the growth reaction of the silicon film.

Specific examples of the present invention are described above in detail, but these examples are merely illustrative and place no limitation on the scope of the patent claims. The technology described in the patent claims also encompasses various changes and modifications to the specific examples described above. Further, the technical elements explained in the present specification or drawings provide technical utility either independently or through various combinations. The present invention is not limited to the combinations described at the time the claims are filed. Further, the purpose of the examples illustrated by the present specification or drawings is to satisfy multiple objectives simultaneously, and satisfying any one of those objectives gives technical utility to the present invention

The invention claimed is:

1. A vapor-phase growth method for growing a silicon film on a surface of a substrate,
    the method comprising supplying a mixed material gas that includes a chlorosilane gas and a carrier gas to the surface of the substrate heated at 1200 to 1400° C. from a direction perpendicular to the surface, wherein
    a melting point of the substrate being higher than that of silicon,
    a supply rate of the chlorosilane gas is equal to or more than 200 μmol per minute per 1 $cm^2$ of the surface, and
    the carrier gas includes a hydrogen gas and at least one or more gases selected from argon, xenon, krypton and neon,
    wherein the mixed material gas is supplied while the substrate is rotated at equal to or more than 1000 rpm.

2. The method according to claim 1, wherein a volume percent of the at least one or more gases selected from argon, xenon, krypton and neon included in the carrier gas is 0.01 to 10 vol %.

3. A vapor-phase growth method for growing a silicon film on a surface of a substrate, the method comprising supplying a mixed material gas that includes a chlorosilane gas and a carrier gas to the surface of the substrate heated at 1200 to 1400° C. from a direction perpendicular to the surface, wherein a melting point of the substrate being higher than that of silicon, a supply rate of the chlorosilane gas is equal to or more than 200 μmol per minute per 1 $cm^2$ of the surface, and the carrier gas includes a hydrogen gas and at least one or more gases selected from argon, xenon, krypton and neon, wherein the substrate is kept heated at 1200 to 1350° C.

4. The method according to claim 3, wherein a volume percent of the at least one or more gases selected from argon, xenon, krypton and neon included in the carrier gas is 0.01 to 10 vol %.

\* \* \* \* \*